(12) United States Patent
Sun

(10) Patent No.: US 8,168,372 B2
(45) Date of Patent: May 1, 2012

(54) METHOD OF CREATING PHOTOLITHOGRAPHIC STRUCTURES WITH DEVELOPER-TRIMMED HARD MASK

(75) Inventor: Sam X. Sun, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 1156 days.

(21) Appl. No.: 11/858,546

(22) Filed: Sep. 20, 2007

(65) Prior Publication Data

US 2008/0076064 A1    Mar. 27, 2008

Related U.S. Application Data

(60) Provisional application No. 60/826,875, filed on Sep. 25, 2006.

(51) Int. Cl.
- *G03F 7/20* (2006.01)
- *G03F 7/30* (2006.01)
- *G03F 7/36* (2006.01)
- *G03F 7/40* (2006.01)
- *G03F 7/09* (2006.01)

(52) U.S. Cl. ........ 430/311; 430/313; 430/317; 430/318; 430/319; 430/323; 430/326; 430/9; 430/11; 430/17; 430/18; 430/271.1; 430/272.1; 430/275.1; 430/278.1; 430/449; 430/454

(58) Field of Classification Search ......... None
See application file for complete search history.

(56) References Cited

U.S. PATENT DOCUMENTS 6,284,613 B1 * 9/2001 Subrahmanyam et al. ... 438/307
(Continued)

FOREIGN PATENT DOCUMENTS

EP    0 092 782    11/1983
(Continued)

OTHER PUBLICATIONS

Dreeskornfeld el al., "Comparison of trimming techniques for sublithographic silicon structures," Japanese Journal of Applied Physics, vol. 45, No. 6B, Jun. 2006, pp. 5552-5555.

(Continued)

*Primary Examiner* — Sin J. Lee
(74) *Attorney, Agent, or Firm* — Hovey Williams LLP

(57) ABSTRACT

Novel, developer-soluble, hard mask compositions and methods of using those compositions to form microelectronic structures are provided. The composition comprises the compound

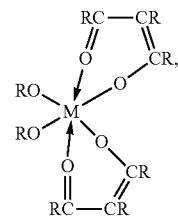

a compound for controlling development rate, and a crosslinking agent in a solvent system. The methods involve applying the composition to a substrate and curing the composition. An imaging layer is applied to the composition, followed by light exposure and developing, during which the light-exposed portions of the imaging layer are removed, along with portions of the hard mask composition adjacent said light-exposed portions. The size of the hard mask composition structures are controlled by the development rate, and they yield feature sizes that are a fraction of the imaging layer feature sizes, to give a pattern that can ultimately be transferred to the substrate.

20 Claims, 5 Drawing Sheets

U.S. PATENT DOCUMENTS

| | | | |
|---|---|---|---|
| 6,500,599 B1 * | 12/2002 | Inno et al. | 430/273.1 |
| 6,509,253 B1 * | 1/2003 | Yu | 438/585 |
| 7,008,832 B1 * | 3/2006 | Subramanian et al. | 438/182 |
| 7,122,455 B1 | 10/2006 | Lyons et al. | |
| 7,632,670 B2 * | 12/2009 | Offenhausser et al. | 435/287.1 |
| 2003/0228823 A1 * | 12/2003 | Lu | 445/24 |
| 2003/0235786 A1 * | 12/2003 | Krishnamurthy et al. | 430/272.1 |
| 2004/0146809 A1 | 7/2004 | Lee et al. | |
| 2004/0259037 A1 | 12/2004 | Hatakeyama et al. | |
| 2005/0031964 A1 | 2/2005 | Babich et al. | |
| 2005/0167394 A1 | 8/2005 | Iiu et al. | |
| 2006/0019195 A1 | 1/2006 | Hatakeyama et al. | |
| 2006/0046483 A1 | 3/2006 | Abatchev et al. | |
| 2006/0228895 A1 | 10/2006 | Chae et al. | |
| 2007/0212648 A1 | 9/2007 | Lalbahadoersing | |
| 2007/0212649 A1 | 9/2007 | Lalbahadoersing | |
| 2008/0057445 A1 * | 3/2008 | Brueck et al. | 430/323 |

FOREIGN PATENT DOCUMENTS

| | | |
|---|---|---|
| WO | WO 02/14954 | 2/2002 |
| WO | 2004001806 | 12/2003 |
| WO | 2005001901 | 1/2005 |

OTHER PUBLICATIONS

Cord et al., "Robust shadow-mask evaporation via lithography controlled undercut," Journal of Vacuum Science Technology B, vol. 24, No. 6, Nov. 2006, pp. 3139-3143.

The International Search Report and Written Opinion in PCT application No. PCT/US2007/079217 dated Mar. 5, 2008.

Aristov et al., "Multilayer Resists with Variable Layer Parameters for Submicron Lithography," Microelectronic Engineering, vol. 11, 1990, 553-556.

* cited by examiner

METHOD OF CREATING PHOTOLITHOGRAPHIC STRUCTURES WITH DEVELOPER-TRIMMED HARD MASK

RELATED APPLICATIONS

This application claims the priority benefit of a provisional application entitled METHOD OF CREATING PHOTOLITHOGRAPHIC STRUCTURES WITH DEVELOPER-TRIMMED HARD MASK, Ser. No. 60/826,875, filed Sep. 25, 2006, incorporated by reference herein

BACKGROUND OF THE INVENTION

1. Field of the Invention

The present invention is broadly concerned with novel, developer-soluble, hard mask compositions and methods that utilize hard mask compositions to form structures on semiconductor substrates.

2. Description of the Prior Art

As integrated circuit chip makers continue to press for higher circuit density, the process of fabricating such circuitry is constantly challenging the limits of photolithography. The most prominent achievement in recent years in this regard is the maturity of ArF technology, and the development of immersion photolithography.

Efforts in those technologies are based on the very basic principles of optical physics, i.e., projected image resolution is proportional to the numerical aperture of the projection lenses and to the reciprocal of incident wavelength. The cost of using these principles to enhance resolution, however, is a significant reduction in the depth of focus (DOF).

DOF is a very practical matter that determines the robustness of photolithographic processes and ultimately the yield of final devices. To compensate for the DOF loss, the photoresist thickness must be reduced. Unfortunately, a limit exists for photoresist thickness reduction in the traditional single-layer scheme. The limit is determined by etch depth aid selectivity of photoresist to substrate. Etch selectivities of ArF photoresists have been improved significantly in the last few years while further improvement of organic polymer-based photoresists has been marginal.

Many new photolithographic processes, such as bilayer or multilayer schemes, have been explored to reduce photoresist thickness from the aspect of etch selectivity. Another option that has been used is photoresist trimming processes through isotropic etch. The trimming process can reduce feature size beyond the capability of photolithography, and the trimmed lines, for example, can be very important for fabricating transistor gates to improve device speed. However, there are two fundamental disadvantages to this process. First, photoresist patterns are trimmed not only laterally, but also vertically. In essence, the vertical etch rate is normally as high as three times the lateral etch rate. Thus, a significant amount of the already tightly budgeted photoresist thickness is lost in the trimming process. Second, the trimming plasma will inevitably etch the underling layer. This undesired etch sometimes can be severe.

SUMMARY OF THE INVENTION

The present invention overcomes the problems of the prior art by providing novel compositions and methods that do not suffer from the above drawbacks. The invention includes a composition useful as a hard mask layer. The composition comprises:

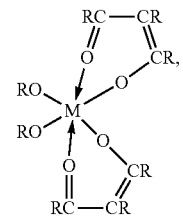

(B) a compound comprising at least one —OH group;
(C) a crosslinking agent; and
(D) a solvent system, wherein (A), (B), and (C) are dissolved or dispersed in said solvent system.

The present invention further provides methods of using this and other developer soluble hard mask compositions to form microelectronic structures with nanosized features. The present invention is also concerned with structures formed by these methods.

In a further embodiment, the invention provides a microelectronic structure comprising a microelectronic substrate having a surface, and a T-shaped structure on the substrate surface or on an intermediate layer on the substrate surface. The T-shaped structure comprises an upright leg having upper and lower portions joined by opposing vertical sidewalls. The lower portion contracts the substrate surface or intermediate layer, and the vertical sidewalls and substrate surface form an angle of from about 80° to about 100°. The leg has a width "W" defined as the greatest distance between the vertical sidewalls. The T-shaped structure also comprises a generally horizontal section. The generally horizontal section has an upper surface and is adjacent to the upper portion or an intermediate layer on the upper portion. The generally horizontal section is also generally perpendicular to the vertical sidewalls. The T-shaped structure has a height "H" defined as the greatest distance from the substrate surface to the upper surface, where "H"/"W" is from about 2 to about 5.

DETAILED DESCRIPTION OF THE PREFERRED EMBODIMENTS

Figure 1A:
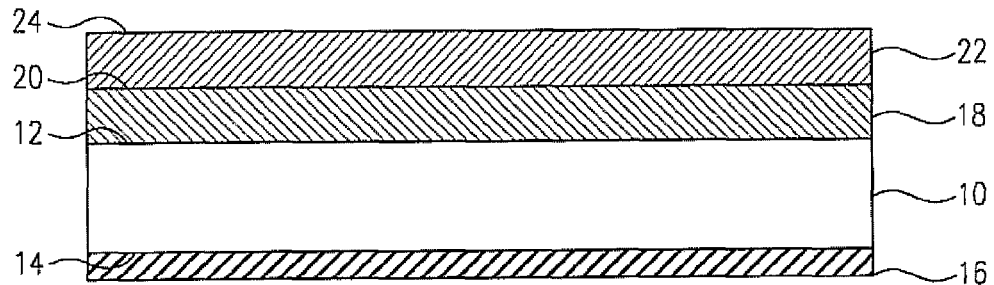
FIG. 1A-1D are schematics showing one embodiment of the inventive process.

The present invention is concerned with novel compositions that are useful as hard masks during the fabrication of microelectronic devices, as well as novel methods of using hard masks. The composition preferably comprises

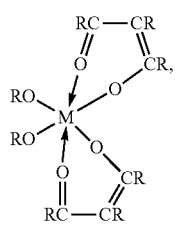

(I)

where M is selected from the group consisting of Ti and Zr, and each R is individually selected from the group consisting of hydrogen and alkyls (branched or unbranched—preferably from about $C_1$ to about $C_{12}$, and more preferably from about $C_1$ to about $C_6$). In a particularly preferred embodiment, R is selected from the group consisting of hydrogen, —$CH_3$, and —$C_3H_7$ (available from DuPont under the name Tyzor®).

The composition preferably comprises from about 1% to about 20% by weight of Formula (I), more preferably from about 2% to about 15% by weight of Formula (I), and even more preferably from about 3% to about 10% by weight, based upon the total weight of the composition taken as 100% by weight. More particularly, Formula (I) is included at levels to yield levels of M of from about 5% to about 40% by weight, and more preferably from about 10% to about 30% by weight, based upon the total weight of the solids taken as 100% by weight.

In addition to Formula (I), the composition also preferably comprises a compound (II) that includes at least one group that can form covalent bonds with M of Formula (I) above. Preferred such groups include —$OR^1$, where $R^1$ is selected from the group consisting of hydrogen and alkyls (branched or unbranched—preferably from about $C_1$ to about $C_{12}$, and more preferably from about $C_1$ to about $C_6$). In a particularly preferred embodiment, these groups are selected from the group consisting of —OH and —$OC_2H_5$.

This compound (II) should be of electronic grade and should also be stable in the hard mask formulation. That is, the compound should remain in solution at ambient storage conditions (i.e., 20-25° C.) for at least about 30 days.

This compound (II) is important for development rate control. That is, using higher quantities of the compound will yield a composition with a faster development rate, while using lower quantities of the compound will yield a composition with a slower development rate. One of ordinary skill in the art can adjust the quantity of the compound to obtain the desired development rate for the particular process being carried out. At the same time, the quantity of the compound will generally be from about 0.1% to about 15% by weight, more preferably from about 0.2% to about 10% by weight, and even more preferably from about 0.2% to about 2% by weight, based upon the total weight of the composition taken as 100% by weight.

In one embodiment, this compound (II) can also include light attenuating moieties selected to absorb light of a desired wavelength. These moieties can be selected to absorb light at wavelengths of from about 400 nm to about 10 nm, and examples of suitable light absorbing moieties include benzyl rings. One preferred such compound (II) for use in this invention has the formula

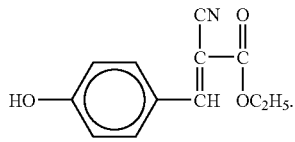

The inventive compositions also preferably include a crosslinking agent. Preferred crosslinking agents include those selected from the group consisting of aminoplasts, glycourils, and epoxies, with aminoplasts being the most preferred. A particularly preferred group of crosslinkers is sold under the tradename Cymel® by Cytec Industries Inc. The crosslinking agent is preferably included in the composition at levels of from about 0.1% to about 15% by weight, more preferably from about 1% to about 10% by weight, and even more preferably from about 1% to about 5% by weight, based upon the total weight of the composition taken as 100% by weight.

The composition also can include a number of optional ingredients, if desired. Examples of suitable optional ingredients include those selected from the group consisting of surfactants and adhesion promoters. In one embodiment, it is preferred that the composition be substantially free (i.e., less than about 0.1% by weight and preferably about 0% by weight) of any catalysts. Catalysts include photoacid generators and any other agent capable of initiating polymerization or crosslinking, either thermally or via light exposure Thus, the composition is preferably non-photosensitive (i.e., a pattern cannot be defined in the layer when it is exposed to about 1 J/cm²).

All of the above ingredients are dispersed or dissolved in a solvent system. The solvent system utilized in the hard mask composition should have a boiling point of from about 100° C. to about 300° C., and preferably from about 120° C. to about 200° C. The solvent system should be utilized at a level of from about 70% to about 98% by weight, and preferably from about 80% to about 95% by weight, based upon the total weight of the hard mask composition taken as 100% by weight. Preferred solvent systems are organic and include a solvent selected from the group consisting of propyleneglycol propyl ether, methyl isoamyl ketone, di(ethylene glycol) dimethyl ether, ethyl-3-ethoxypropionate, propylene glycol monomethyl ether acetate, ethyl lactate, cyclohexanone, and mixtures thereof.

The inventive process is illustrated in FIG. 1, and in FIG. 1A, a substrate 10 is provided. Substrate 10 can be any typical microelectronic substrate, including those selected from the group consisting of silicon, silicon oxide, silicon nitride, silicon oxynitride, aluminum, tungsten, tungsten silicide, gallium arsenide, germanium, tantalum, tantalum nitrite, and SiGe. Substrate 10 has upper and lower surfaces 12, 14, and in the embodiment shown, there is an etch stop layer 16 adjacent lower surface 14.

A hard mask composition such as the one described above is applied to upper surface 12 of substrate 10 to form hard mask layer 18 having an upper surface 20. The composition can be applied by any known application method, with one preferred method being spin-coating the composition at speeds of from about 1,000 rpm to about 3,000 rpm, preferably from about 1,500 rpm to about 2,500 rpm, for a time period of from about 10 seconds to about 90 seconds, and preferably from about 20 seconds to about 60 seconds. Furthermore, while the embodiment illustrated in FIG. 1A shows layer 18 being applied directly to upper surface 12 of substrate 10, it will be appreciated that any number of optional intermediate layers (e.g., anti-reflective layers, low k dielectric layers, silicon nitride layers, carbon film) can be included between substrate 10 and layer 18, with layer 18 being applied to the uppermost intermediate layer.

Layer 18 can then be subjected to an optional post-application bake to remove the solvent(s). A post-application bake would typically carried out at a temperature of from about 80° C. to about 160° C., and more preferably from about 110° C. to about 140° C., for a time period of from about 10 seconds to about 60 seconds, and more preferably from about 20 seconds to about 40 seconds. The layer 18 is then subjected to a curing bake, typically at temperatures of from about 160° C. to about 200° C., and more preferably from about 175° C. to about 185° C., for a time period of from about 30 seconds to about 90 seconds, and more preferably from about 40 seconds to about 60 seconds.

During this curing bake, the components within the hard mask layer 18 will react with one another to form a cured layer. In embodiments where the composition described above is utilized as the hard mask composition, chemical reactions will occur between the components to form bonds selected from the group consisting of

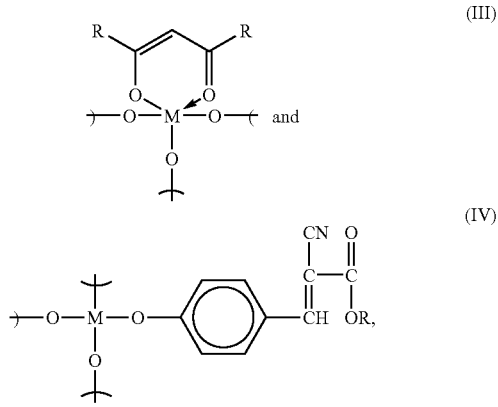

and mixtures thereof, where M and R are the same as previously defined. It is believed that the crosslinking agent does not react with Formula (I), but that the crosslinking agent instead self-crosslinks and possibly reacts with compound (II) to occupy space within the "matrix" that is formed by (III) and (IV).

Typical thicknesses of the cured layer 18 will be from about 20 nm to about 120 nm, and more preferably from about 30 nm to about 70 nm. In embodiments where the layer 18 has been formulated to provide anti-reflection properties, the k value of the cured layer is at least about 0.1, and preferably from about 0.2 to about 0.6 at wavelengths of from about 400 nm to about 10 nm. The n value of the cured layer is at least about 1.0, and preferably from about 1.5 to about 2.0 at wavelengths of from about 400 nm to about 10 nm.

The cured layer 18 will be substantially insoluble in typical photoresist solvents. Thus, when subjected to a stripping test, the layer 14 will have a percent stripping of less than about 5%, preferably less than about 1%, and even more preferably about 0%. The stripping test involves first determining the thickness (by taking the average of measurements at five different locations) of the cured layer. This is the initial average film thickness. Next, a solvent (e.g., ethyl lactate, PGME, PGMEA) is puddled onto the cured film for about 20 seconds, followed by spin drying at about 2,000-3,500 rpm for about 20-30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left( \frac{\text{amount of stripping}}{\text{initial average film thickness}} \right) \times 100$$

After curing of layer 18, an imaging layer or photoresist (i.e., photosensitive) composition is applied to upper surface 20 of layer 18 so as to form imaging layer 22 having an upper surface 24. The photoresist composition can be any commercially available photoresist and can be chosen based upon the wavelength of use. The photoresist is typically spin-applied (e.g., from about 1,500 rpm to about 2,500 rpm for about 60 seconds), but any known application method can be used. The layer 22 is subsequently baked, typically at temperatures of from about 80° C. to about 120° C. These are simply exemplary spin speeds and times and bake temperatures and times. These variables can be chosen by one of ordinary skill in the art, and/or the recommendations of the photoresist composition manufacturer can be followed.

The thickness of imaging layer 22 after baking is typically less than about 250 nm, preferably less than about 100 nm, more preferably less than about 50 nm, and even more preferably from about 20 nm to about 40 nm. Furthermore, while the embodiment illustrated in FIG. 1A shows imaging layer 22 being applied directly to upper surface 20 of hard mask layer 18, it will be appreciated that any number of optional intermediate layers as listed above can be included between imaging layer 22 and hard mask layer 18, with imaging layer 22 being applied to the uppermost intermediate layer.

A mask (not shown) is positioned above the surface 24 of imaging layer 22, and light having the desired wavelength is directed at the mask, which has openings that are designed to permit light to pass therethrough and to contact surface 24 of imaging layer 22. Those skilled in the art will readily understand that the arrangement of openings is designed based upon the desired pattern to be formed in imaging layer 22, hard mask layer 18, and ultimately in the substrate surface 12. The present inventive process can be used with UV light having wavelengths of from about 400 nm to about 10 nm, but wavelengths of 13.5 nm, 157 nm, 193 nm, 248 nm, and 365 nm are most preferred.

Upon being exposed to light, the portions of the imaging layer 22 that are exposed to light undergo a reaction which renders those portions developer soluble. Advantageously, hard mask layer 18 is developer soluble prior to light exposure and remains so after light exposure. "Developer soluble" as used herein means the portions contacted with conventional aqueous developers such as tetramethyl ammonium hydroxide and KOH developers can be substantially removed by those developers. At least about 95%, preferably at least about 99%, and even more preferably about 100% of the portions will be removed by a base developer such as tetramethyl ammonium hydroxide (TMAH, typically 0.26 N) and/or KOH (typically 30-40%) developers after 40 seconds of contact.

Thus, after light exposure, the imaging layer 22 and hard mask layer 18 are contacted with a developer such as TMAH or KOH developers. The developer contact step can be carried out via conventional methods (e.g., immersion, puddling, spray) for varying lengths of time, depending upon the degree of hard mask layer 18 removal (including lateral removal of hard mask layer 18 at portions below remaining portions of imaging layer 22) that is desired for the particular process. Typically, developer contact will be carried out for a time period of from about 20 seconds to about 60 seconds, and more preferably from about 35 seconds to about 45 seconds. During this contact, the developer removes the light-exposed portions of imaging layer 22 and portions of hard mask layer 18 under those light-exposed portions to leave behind openings 26. Openings 26 can be holes, trenches, spaces, etc., and will ultimately be transferred to the substrate 10. The hard mask layer 18 will be removed by developers such as TMAH and KOH developers at a rate of from about 0.5 nm/second to about 10 nm/second, and more preferably from about 1 nm/second to about 3 nm/second.

After developer contact, T-shaped structures 28 remain on surface 12 of substrate 10, or on any intermediate layers that are included on surface 12. The T-shaped structures 28 are formed because the hard mask layer 18 is developer soluble, and lateral etching of that layer 18 will occur tinder the non-light exposed portions of imaging layer 22, with the amount of etching increasing as developer contact time is increased.

T-shaped structures 28 comprise an upright leg 30 and a generally horizontal section 32. Legs 30 are chemically identical to hard mask layer 18 after baking, and comprise upper and lower portions 34, 36, joined by opposing vertical sidewalls 38a, 38b. Sidewalls 38a, 38b are generally parallel to one another, and are also generally perpendicular to substrate surface 12, with lower portion 36 contacting surface 12, or any intermediate layers that may be present on surface 12. That is, the angle "A" formed by a vertical sidewall 38a or 38b and substrate surface 12 is from about 70° to about 110°, more preferably from about 80° to about 100°, and even more preferably from about 85° to about 95°.

Sections 32 are chemically identical to imaging layer 22 after baking, and comprise respective upper and lower surfaces 40a, 40b and endwalls 42a, 42b. Upper and lower surfaces 40a, 40b are generally parallel to one another and to surface 12, while endwalls 42a, 42b are generally parallel to one another and to sidewalls 38a, 38b, while being generally perpendicular to surface 12. Lower surface 40b of section 32 is adjacent upper portion 34 of leg 30.

Figure 1B:
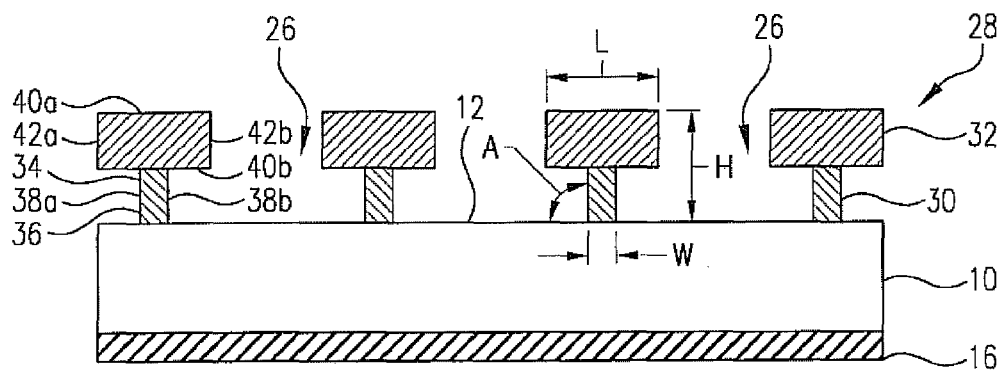

As shown in FIG. 1B, leg 30 has a width "W,"[1] which is measured at the point of the greatest distance between vertical sidewalls 38a, 38b. Advantageously, this process allows "W" to be controlled and made relatively small by adjusting the development time as discussed above without losing any of the overall height of legs 30 during etching or other processing. The inventive process can result in a "W" of less than about 70 nm, preferably less than about 50 nm, and even more preferably less than about 40 nm.

Section 32 has a length "L," which is the greatest distance along a plane that is generally parallel to "W." In some applications, "W" will be approximately equal to "L." However, in preferred embodiments, "W" is smaller than "L." In these embodiments, "W" is 80% or less of "L," and more preferably from about 40% to about 60% of "L." Furthermore, as also shown in FIG. 1B, the T-shaped structure 28 has an overall height "H," defined as the greatest distance from the substrate surface 12 to the upper surface 40a of section 32. It is preferred that "H"/"W" is from about 2 to about 5, and even more preferably from about 3 to about 4. Thus, the line widths have been reduced over that of the line widths achieved with the imaging layer 22, providing a significant advantage over the prior art.

Figure 1C:
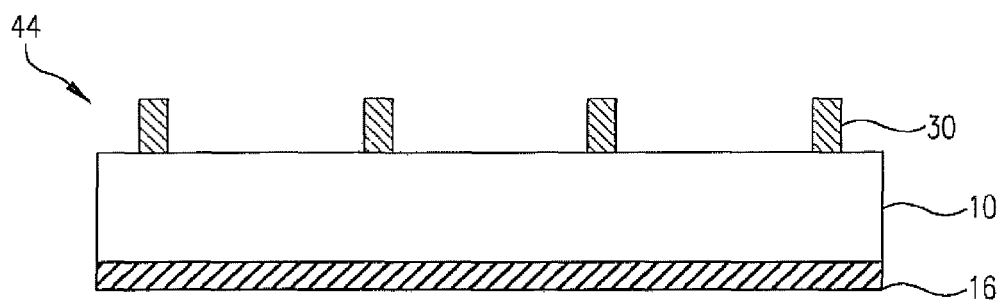
Figure 1D:
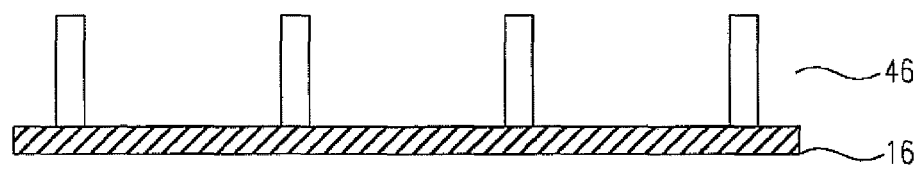

As shown in FIG. 1C, the remaining imaging layer 22 (in the form of sections 32) is removed, typically with an organic solvent (e.g., commercially-available edge bead removers or pre-wet solvents), to leave behind a patterned layer 44. Referring to FIG. 1D, the pattern of patterned layer 44 is transferred to the substrate 10 via conventional methods (e.g., etching) to form patterned substrate 46. The hard mask layer 18 (in the form of legs 30) has a very low etch rate, and etches much slower than the substrate. That is, the hard mask layer 18 etches at rates of less than about 1/5, preferably less than about 1/10, more preferably less than about 1/25, and even more preferably from about 1/40 to about 1/100 of the etch rate of typical substrates 10 (e.g., silicon substrate, metal substrates, polymer films). This is true in conventional etchants, including HBr, chlorine, and oxygen etchants. The structure shown in FIG. 1D is ready for further fabrication steps such as metallization.

Figure 2A:
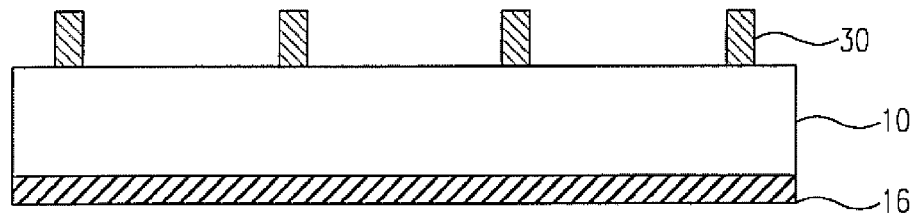
FIG. 2A-2D are schematic showing another embodiment of the invention where a double-patterning process is employed.
Figure 2B:
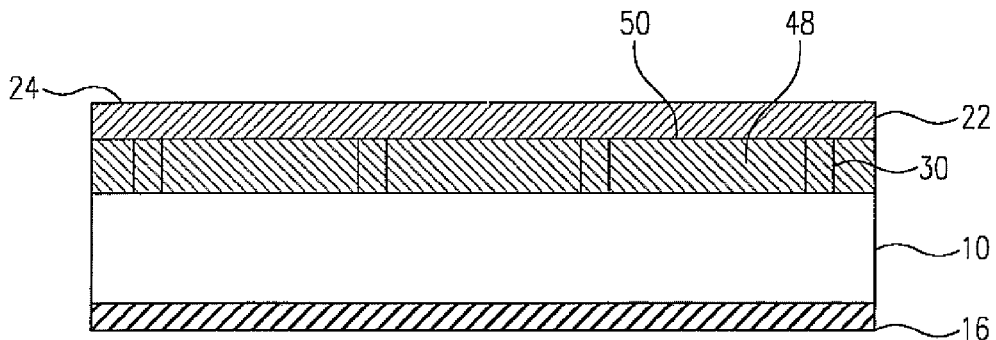

Advantageously, the invention can be used with double patterning processes as well, thus improving the resolution achieved by a factor of 2 or more. This process is illustrated in FIG. 2, and like numbering is used for all embodiments to designate similar materials. FIG. 2A corresponds to FIG. 1C, and shows how FIG. 1C could then be used as part of a double patterning process rather than the process described in FIG. 1. That is, the structure of FIG. 1C/2A that has been coated, subjected to lithography, and developed, can now be coated, subjected to lithography, and developed again to create further patterns. Referring to FIG. 2B, legs 30 are first preferably subjected to a hardening bake. This is preferably carried out at temperatures of at least about 210° C., and more preferably from about 220° C. to about 280° C., for a time period of from about 30 seconds to about 90 seconds, and more preferably from about 30 seconds to about 60 seconds. Hardening can also be effected using radiation instead of, or in addition to, baking.

Next, a hard mask composition is applied to form a second hard mask layer 48 having an upper surface 50. Because the layer 18 was cured and legs 30 then hardened, this second coating step is possible while maintaining the previously-formed legs 30 intact. The composition application steps would be similar to that described above with respect to FIG. 1. Furthermore, one would typically use the same hard mask composition used in the FIG. 1 embodiment, but this is not required, and different compositions could be used if desired. The same baking conditions would be followed as described above, and similar thicknesses and etch rates would be achieved. An imaging or photoresist layer 22 would also be formed on upper surface 50 as described previously.

Figure 2C:
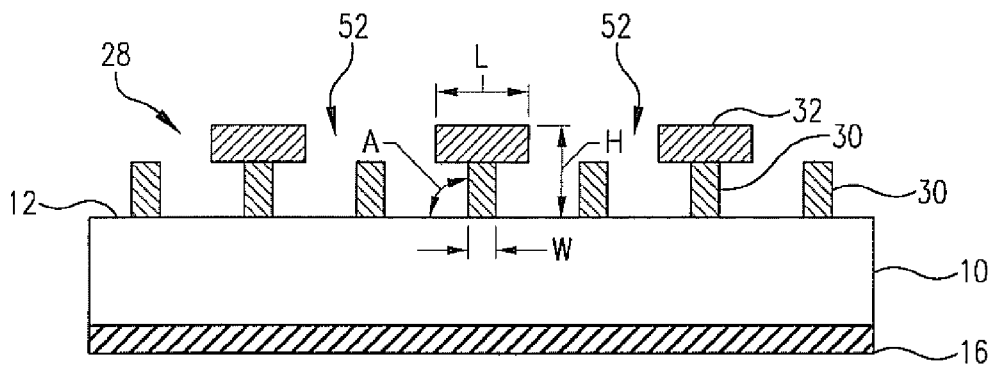
Figure 2D:
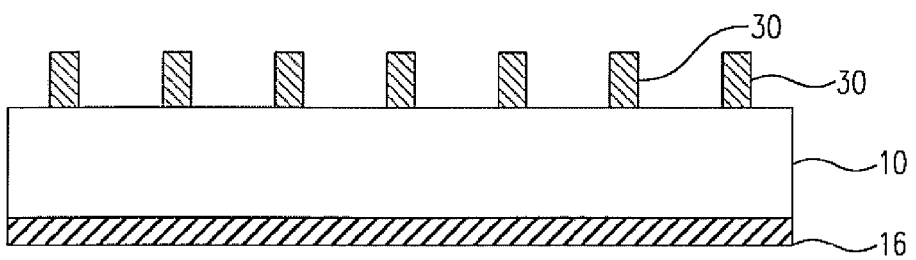

In FIG. 2C, a mask (not shown) having the desired pattern formed therein is positioned over surface 24 of imaging layer 22, and light exposure is repeated as described above. Again, exposed portions are formed in imaging layer 22, followed by contact with a developer to remove the exposed portions of layer 22, as well as portions of hard mask layer 18 below those exposed portions, to leave behind openings 52. These openings 52 can be holes, trenches, or spaces. The same T-shaped structures 28 are formed, having the same structural features and properties described previously. The sections 32 are again removed, such as with an organic solvent, to leave the structure shown in FIG. 2D. The raised portions or legs 30 (similar to legs 30 discussed in FIG. 1) remaining on substrate surface 12 in FIG. 2D are typically referred to as lines or raised features. This pattern of holes, trenches, spaces, lines, and raised features will ultimately be transferred to the substrate 10.

The above coating, baking, light exposure, developing, and imaging layer removal steps can be repeated as many more times as desired and as is feasible for the particular pattern to be formed in substrate surface 12. The structure of FIG. 2C is subjected to the remaining steps described previously to transfer the pattern to the substrate 10. The patterned substrate is then subjected to further fabrication steps (e.g., metallization).

EXAMPLES

The following examples set forth preferred methods in accordance with the invention. It is to be understood, however, that these examples are provided by way of illustration and nothing therein should be taken as a limitation upon the overall scope of the invention.

Example 1

Developer-Soluble Hard Mask Formulation I

The ingredients of this formulation are listed in Table 1. The raw materials were mixed under agitation in the following order: Tyzor® BTP, ethylacetoacetate, solvent, Cymel® 1303LF; and 2-cyano-3-(4-hydroxy-phenyl)-acrylic acid ethyl ester. The mixture was filtered through a 0.1-micron membrane to remove particles. The final formulation produced a film of 70 nm±5 nm when spin-coated on a silicon wafer at 2,000 rpm for 40 seconds, followed by a two-stage bake at 120° C. for 30 seconds and 180° C. for 60 seconds. The film was dissolved in 0.26-N TMAH at a rate of 5 nm/second±1 nm/second. The index of refraction (i.e., n value) of the film was 1.6±0.05 at 193 nm, 1.8±0.05 at 248 nm, and 1.7±0.05 at 365 inn. The extinction coefficient (i.e., k value) of the film was 0.44±0.05 at 193 nm, 0.42±0.05 at 248 nm, and 0.40±0.05 at 365 nm.

TABLE I

Hard Mask Formulation I

| INGREDIENTS | % BY WEIGHT[A] |
|---|---|
| Tyzor ® BTP (polydibutyltitanate, obtained from DuPont) | 6.28% |
| Ethylacetoacetate (obtained from Aldrich) | 7.90% |
| Cymel ® 303LF (obtained from Cytec Industries) | 1.62% |
| 2-cyano-3-(4-hydroxy-phenyl)-acrylic acid ethyl ester (obtained from St-Jean Photochemicals) | 1.62% |
| Propyleneglycolpropyl ether (obtained from General Chemical Corp.) | 82.58% |

[A]Based upon the total weight of all ingredients in the composition taken as 100% by weight.

Example 2

Developer-Trimmed Hard Mask in Conjunction with KrF Resist

Figure 3:
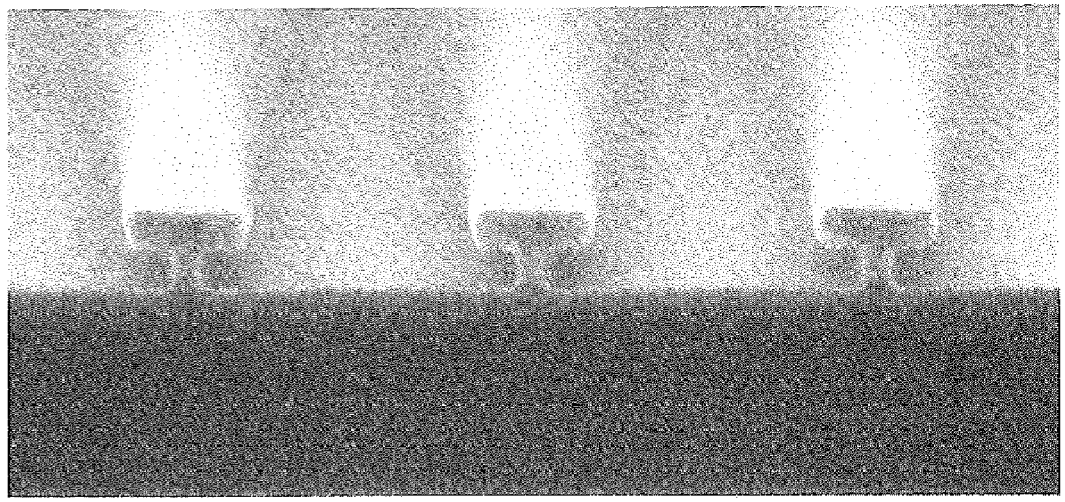
FIG. 3 is a scanning electronic microscope (SEM, 200 KX) photograph showing a cross-section of the wafer tested in Example 2.

The developer-soluble hard mask composition prepared in Example 1 was spin-coated onto a 200-mm silicon wafer. The hard mask layer was thermally cured at 205° C. for 60 seconds on a hot surface. The thermally-set, developer-soluble hard mask layer film had a thickness of 70 nm. A commercial KrF photoresist (UV210, obtained from Rohm & Haas) was diluted with ethyl lactate to one-sixth (⅙) of the original solids content. The diluted photoresist was applied on the hard mask layer by spinning to form a photoresist film having a thickness of 50 nm. The wafer with all the films was baked at 130° C. for 60 seconds as a post-application bake (PAB). The wafer was then exposed on a SVGL/ASML Microscan III (0.6 NA) at a wavelength of 248 nm. A post-exposure bake (PEB) was carried out at 130° C. for 90 seconds. The wafer was developed using 0.26 N tetramethylammonium hydroxide (TMAH) for 60 seconds. The resulting line patterns are shown in FIG. 3. Line patterns of the hard mask had a width of 42 nm.

Example 3

Developer-Trimmed Hard Mask in Conjunction with ArF Resist

Figure 4:
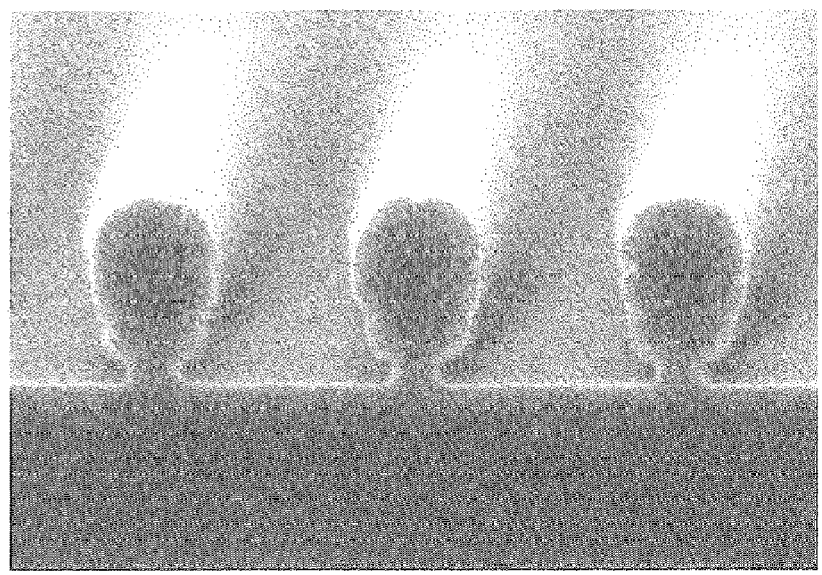
FIG. 4 is an SEM (200 KX) photograph showing a cross-section of the wafer tested in Example 3.

The developer-soluble hard mask composition prepared in Example 1 was spin-coated onto a 200-mm silicon wafer. The hard mask was thermally cured at 205° C. for 60 seconds on a hot surface, and the thermally-set, developer-soluble hard mask film had a thickness of 40 nm. A commercial ArF photoresist (TArF-3a-103, obtained from TOK) was applied on the hard mask by spinning to form a film having a thickness of 250 nm. The wafer with all of the films was baked at 110° C. for 60 seconds as a PAB. The wafer was then exposed on an ASML PASS5500/1100 scanner (0.75 NA and 0.89/0.65 sigma) at a wavelength of 193 mm. A PEB was carried out at 110° C. for 60 seconds. The wafer was developed using 0.26N TMAH for 60 seconds. The resulting line patterns are shown in FIG. 4. The resulting line patterns of the hard mask had a width of 66 nm.

Example 4

Developer-Soluble Hard Mask Formulation II

The ingredients of this formulation are listed in Table II. The raw materials were mixed under agitation in the following order: solvent; Tyzor® AA-105; Cymel® 1135; and 2-cyano-3-(4-hydroxy-phenyl)-acrylic acid ethyl ester. The mixture was filtered through a 0.1-micron membrane to remove particles. The final formulation produced a film of 40 nm±5 nm when spin-coated on a silicon wafer at 2,000 rpm for 40 seconds, and followed by a two-stage bake at 120° C. for 30 seconds and then 180° C. for 60 seconds. This film dissolved in 0.26 N TMAH at a rate of 3 nm/sec±1 nm/sec. The index of refraction of the film was 1.6±0.05 at 193 nm, 1.8+0.05 at 248 nm, and 1.7±0.05 at 365 nm. The extinction coefficient of the film was 0.39±0.05 at 193 nm, 0.37±0.05 at 248 nm, and 0.48±0.05 at 365 nm.

TABLE II

Hard Mask Formulation II

| INGREDIENTS | % BY WEIGHT[A] |
|---|---|
| Tyzor ® AA-105 (titanium acetylacetonate, obtained from DuPont) | 4% |
| Cymel ® 1135 (obtained from Cytec Industries) | 1.2% |
| 2-cyano-3-(4-hydroxy-phenyl)-acrylic acid ethyl ester (obtained from St-Jean Photochemicals) | 0.8% |
| Propyleneglycolpropyl ether (obtained from General Chemical Corp.) | 94% |

[A]Based upon the total weight of all ingredients in the composition taken as 100% by weight.

Figure 5:
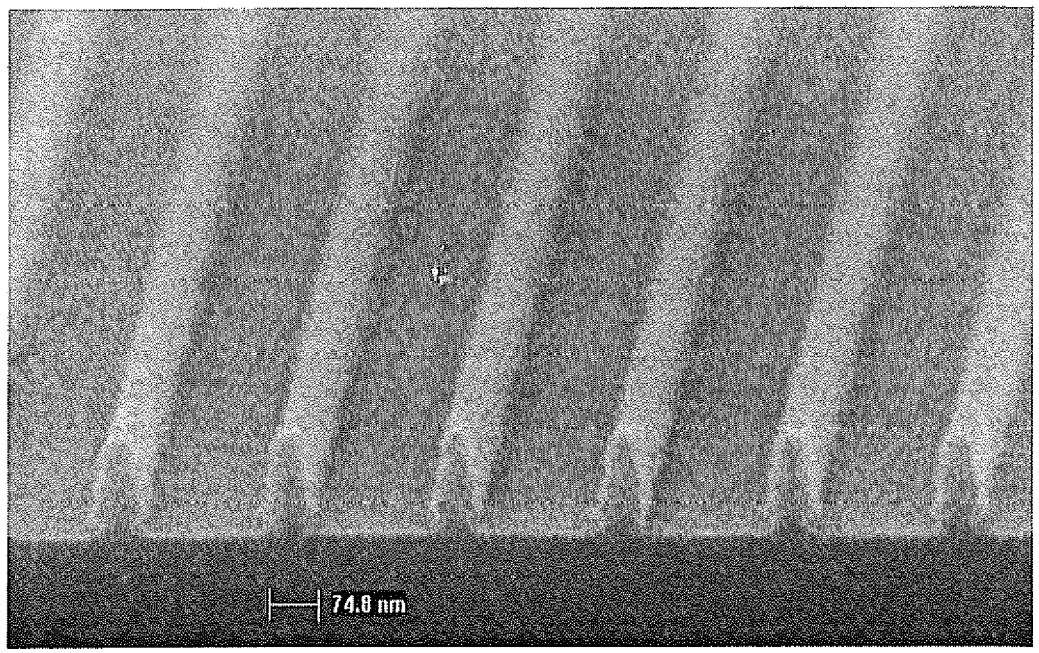
FIG. 5 is an SEM photograph showing a cross-section of the wafer tested in Example 4.

The hard mask Formulation II was spin-coated onto 200-mm silicon wafer, and the film was thermally cured at 120° C. for 40 seconds, followed by 180° C. for 60 seconds on a hot surface. The thermally set, developer-soluble hard mask was a 40-nm thick film. A commercial ArF photoresist (TAI6016, available from TOK) was applied on the hard mask by spinning to form a film having a thickness of 120 nm. The wafer with all the films was baked at 120° C. for 60 seconds as a PAB. The wafer was then exposed on an ASML PASS5500/1100 scanner (0.75 NA and 0.89/0.59 sigma) at a wavelength of 193 nm. The PEB was carried out at 110° C. for 60 seconds. The wafer was developed using 0.26 N TMAH for 60 seconds. The resulting line patterns are shown in FIG. 5. The conditions for this example were not optimized as were those in Examples 2 and 3, which shows the improvements that can be achieved with optimization.

Example 5

Developer-Soluble Hard Mask Formulation III

The ingredients of this formulation are listed in Table III. The raw materials were mixed under agitation in the following the order: solvent, Tyzor® AA-105, Cymel® 1135, and 2-cyano-3-(4-hydroxy-phenyl)-acrylic acid ethyl ester. The mixture was filtered through a 0.1-micron membrane to remove particles. The final formulation produced a film of 40 nm±5 nm when spin-coated onto a silicon wafer at 2,000 rpm for 40 seconds, followed by a two-stage bake at 120° C. for 30 seconds and 180° C. for 60 seconds. This film dissolved in 0.26 N TMAH at a rate of 2 nm/sec±1 nm/sec. The index of refraction of the film was 1.6±0.05 at 193 nm and 1.8±0.05 at 248 nm. The extinction coefficient of the film was 0.45±0.05 at 193 nm and 0.44±0.05 at 248 nm.

TABLE III

Hard Mask Formulation III

| INGREDIENTS | % BY WEIGHT[A] |
|---|---|
| Tyzor ® AA-105 | 5.1% |
| Cymel ® 1135 | 1.2% |
| 2-cyano-3-(4-hydroxy-phenyl)-acrylic acid ethyl ester | 0.5% |
| Propyleneglycolpropyl ether | 93.2% |

[A]Based upon the total weight of all ingredients in the composition taken as 100% by weight.

Figure 6:
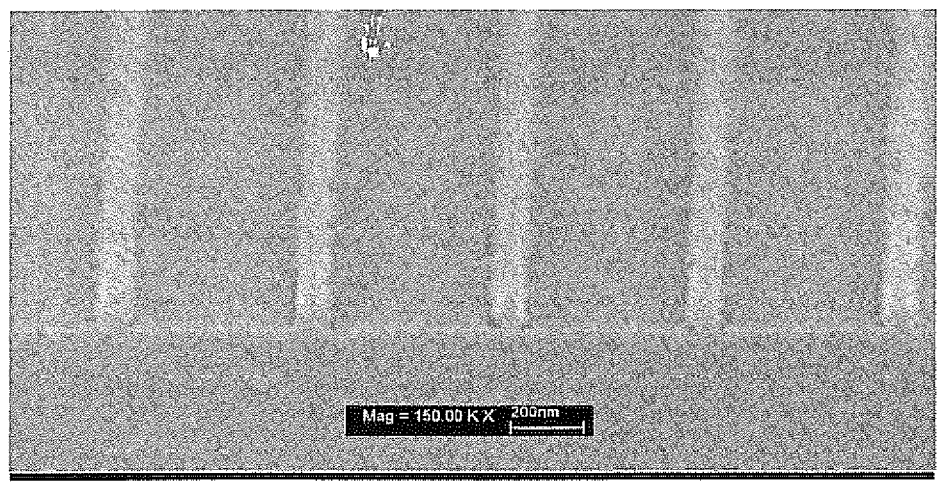
FIG. 6 is an SEM (150 KX) photograph showing a cross-section of the wafer tested in Example 5.

The HM formulation was spin-coated onto a 200-mm silicon wafer, and the hard mask film was thermally cured at 120° C. for 40 seconds, followed by 170° C. for 60 seconds on a hot surface. The thermally set, developer-soluble hard mask was a 40-nm thick film. A commercial ArF photoresist (TAI6016) was applied on the hard mask by spinning to form a film having a thickness of 120 nm. The wafer with all the films was baked at 120° C. for 60 seconds as a PAB. The wafer was then exposed on an ASML PASS5500/1100 scanner (0.75 NA and 0.89/0.59 sigma) at a wavelength of 193 nm. The PEE was carried out at 110° C. for 60 seconds. The wafer was developed using 0.26N TMAH for 60 seconds. The resulting line patterns are shown in FIG. 6. The conditions for this example were not optimized as were those in Examples 2 and 3, which shows the improvements that can be achieved with optimation.

Example 6

Developer-Soluble Hard Mask Formulation IV

The ingredients of this formulation are listed in Table IV. The raw materials were mixed under agitation in the following order: solvent, Tyzor® AA-105, and 2-cyano-3-(4-hydroxy-phenyl)-acrylic acid ethyl ester. The mixture was filtered through a 0.1-micron membrane to remove particles. The final formulation produced a film of 40 nm±5 nm when spin-coated onto a silicon wafer at 2,000 rpm for 40 seconds, followed by a two-stage bake at 120° C. for 30 seconds and 180° C. for 60 seconds. The film dissolved in 0.26 N TMAH at a rate of 2 nm/sec±1 nm/sec. The index of refraction of the film was 1.6±0.05 at 193 nm and 1.8±0.05 at 248 nm. The extinction coefficient of the film was 0.49±0.05 at 193 nm and 0.49±0.05 at 248 nm.

TABLE IV

Hard Mask Formulation IV

| INGREDIENTS | % BY WEIGHT[A] |
|---|---|
| Tyzor ® AA-105 | 6.9% |
| 2-cyano-3-(4-hydroxy-phenyl)-acrylic acid ethyl ester | 0.5% |
| Propyleneglycolpropyl ether | 92.6% |

[A]Based upon the total weight of all ingredients in the composition taken as 100% by weight.

Example 7

Developer-Soluble Hard Mask Formulation V

The ingredients of this formulation are listed in Table V. Tyzor® BTP and 2,4-pentanedione were mixed to form the intermediate in a reactor equipped with a cooling mechanism. The reactor temperature was maintained at room temperature during the exothermic reaction. This intermediate was mixed with the solvent first, and then the remaining ingredients were added under agitation. The mixture was filtered through a 0.1-micron membrane to remove particles. The final formulation produced a hard mask film of 77 nm±5 nm when spin-coated onto a silicon wafer at 2,000 rpm for 40 seconds, followed by a two-stage bake at 120° C. for 30 seconds and 180° C. for 60 seconds. This film dissolved in 0.26 N TMAH at a rate of 4 nm/sec±1 nm/sec. The index of refraction of the film was 1.6±0.05 at 193 nm, 1.8±0.05 at 248 nm, and 1.7±0.05 at 365 nm. The extinction coefficient of the film was 0.39±0.05 at 193 nm, 0.38±0.05 at 248 nm, and 0.41±0.05 at 365 nm.

TABLE V

Hard Mask Formulation V

| INGREDIENTS | % BY WEIGHT[A] |
|---|---|
| Tyzor ® BTP | 4.4% |
| 2,4-Pentanedione (obtained from Aldrich) | 2.6% |
| Cymel ® 303 | 1.6% |
| 2-cyano-3-(4-hydroxy-phenyl)-acrylic acid ethyl ester | 1.4% |
| Propyleneglycolpropyl ether | 90.0% |

[A]Based upon the total weight of all ingredients in the composition taken as 100% by weight.

Figure 7:
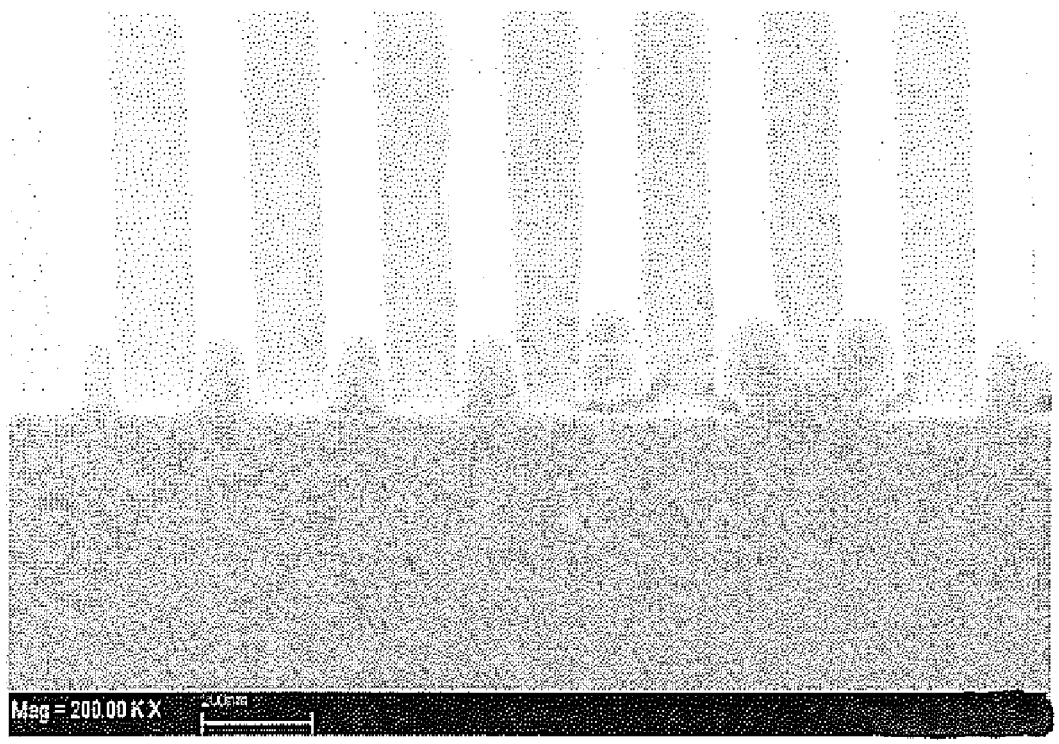
FIG. 7 is an SEM (200 KX) photograph showing a cross-section of the wafer tested in Example 7.

The hard mask formulation was spin-coated onto a 200-mm silicon wafer, and the hard mask film was thermally cured at 120° C. for 40 seconds and followed by 180° C. for 60 seconds on a hot surface. The thermally set, developer-soluble hard mask was a 40-inn thick film. A commercial ArF photoresist (TAI6016) was applied on the hard mask by spinning to form a film of 120 nm. The wafer with all the films was baked at 120° C. for 60 seconds as a PAB. The wafer was then exposed on an ASML PASS5500/1100 scanner (0.75 NA and 0.89/0.59 sigma) at a wavelength of 193 nm. The PEB was carried out at 110° C. for 60 seconds. The wafer was developed using 0.26 N TMAH for 60 seconds. The resulting line patterns are shown in FIG. 7.

I claim:

1. A composition useful as a hard mask layer, said composition comprising:

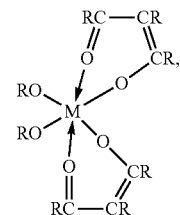

(A)

where: M is selected from the group consisting of Ti and Zr; and each R is individually selected from the group consisting of hydrogen, and alkyls;

(B) a compound comprising at least one —OH group and further comprising an alkoxy group;
(C) a crosslinking agent; and
(D) a solvent system, wherein (A), (B), and (C) are dissolved or dispersed in said solvent system.

2. The composition of claim 1, wherein said crosslinking agent is an aminoplast crosslinking agent.

3. A method of forming a microelectronic structure, said method comprising:
applying a first composition to a microelectronic substrate or to an intermediate layer on said microelectronic substrate to form a hard mask layer thereon, said first composition comprising:

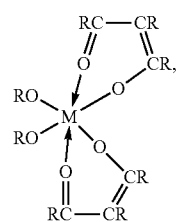

(A)

where: M is selected from the group consisting of Ti and Zr; and each R is individually selected from the group consisting of hydrogen, and alkyls;
(B) a compound comprising at least one —OH group;
(C) a crosslinking agent; and
(D) a solvent system, wherein (A), (B), and (C) are dissolved or dispersed in said solvent system;
applying an imaging layer to said hard mask layer, or to intermediate layers on said hard mask; and
selectively exposing said imaging layer to light having a wavelength of from about 400 nm to about 10 nm to yield light-exposed portions of the imaging layer.

4. The method of claim 3, further comprising contacting said imaging layer and hard mask layer with a developer after said light exposure so that said light-exposed portions, and portions of said hard mask layer adjacent said light-exposed portions, are removed by said developer to yield a patterned layer.

5. The method of claim 4, further comprising:
(a) baking said patterned layer; and
(b) applying a second composition to said patterned layer to form a second hard mask layer on said patterned layer.

6. The method of claim 5, further comprising:
(c) baking said second hard mask layer;
(d) applying an imaging layer to said second hard mask layer;
(e) exposing said imaging layer to light to yield light-exposed portions in said imaging layer; and
(f) contacting said light exposed portions with a developer so as to remove said light-exposed portions, and portions of said hard mask layer adjacent said light-exposed portions, from said substrate, yielding a second patterned layer.

7. The method of claim 6, further comprising:
optionally repeated (b)-(e) one or more times; and
transferring the patterns of the patterned layers to the substrate.

8. The method of claim 7, wherein said transferring comprises etching said patterned layers and substrate.

9. A microelectronic structure comprising:
a microelectronic substrate having a surface, said substrate having an etch rate; and
a T-shaped structure on said substrate surface, or on an intermediate layer on said substrate surface, said T-shaped structure comprising:
an upright leg comprising a hard mask having an etch rate, said leg having upper and lower portions joined by opposing vertical sidewalls that are generally perpendicular to said substrate surface, said lower portion contacting said substrate surface or intermediate layer, wherein said leg has a width "W" measured at the greatest distance between said vertical sidewalls and said horizontal section has a length "L" that is the greatest distance along a plane that is generally parallel to "W," wherein "W" is about 80% or less of "L"; and
a generally horizontal section comprising an imaging layer and being:
adjacent said upper portion or an intermediate layer on said upper portion; and
generally perpendicular to said vertical sidewalls, wherein said hard mask etch rate is less than about ⅓ said substrate etch rate.

10. The structure of claim 9, wherein:
said horizontal section has an upper surface;
said T-shaped structure has a height "H" defined as the greatest distance from the substrate surface to said upper surface;
said leg has a width "W" defined as the greatest distance between said vertical sidewalls; and
"H"/"W" is from about 2 to about 5.

11. The structure of claim 9, said vertical sidewalls and substrate surface forming an angle of from about 80° to about 100°.

12. The structure of claim 9, wherein said hard mask comprises structures selected from the group consisting of

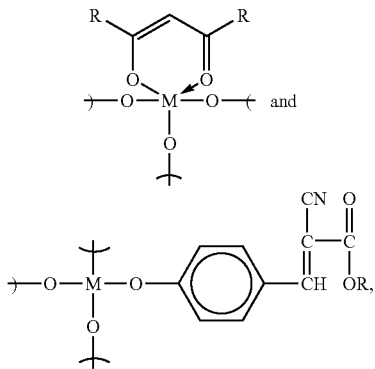

and mixtures thereof, where: M is selected from the group consisting of Ti and Zr; and each R is individually selected from the group consisting of hydrogen and alkyls.

13. The structure of claim 9, wherein said microelectronic substrate is selected from the group consisting of silicon, silicon oxide, silicon nitride, silicon oxynitride, aluminum, tungsten, tungsten silicide, gallium arsenide, germanium, tantalum, tantalum nitrite, and SiGe.

14. A microelectronic structure comprising:
a microelectronic substrate having a surface; and
a T-shaped structure on said substrate surface, or on an intermediate layer on said substrate surface, said T-shaped structure comprising:
an upright leg having upper and lower portions joined by opposing vertical sidewalls, said lower portion contacting said substrate surface or intermediate layer, and said vertical sidewalls and substrate surface forming an angle of from about 80° to about 100°, said leg having a width "W" defined as the greatest distance between said vertical sidewalls; and a generally horizontal section comprising an imaging layer, said generally horizontal section having an upper surface and being:
adjacent said upper portion or an intermediate layer on said upper portion; and
generally perpendicular to said vertical sidewalls, said T-shaped structure has a height "H" defined as the greatest distance from the substrate surface to said upper surface, wherein "H"/"W" is from about 2 to about 5 said upright leg being formed from a material other than an imaging layer.

15. The structure of claim 14, wherein said upright leg comprises structures selected from the group consisting of

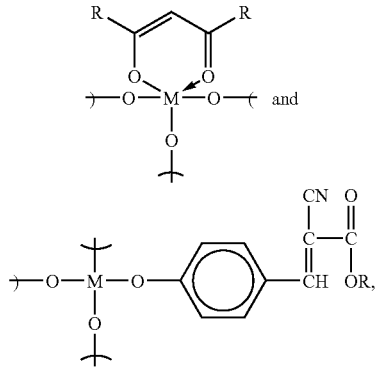

and mixtures thereof, where: M is selected from the group consisting of Ti and Zr; and each R is individually selected from the group consisting of hydrogen and alkyls.

16. The structure of claim 14, wherein said microelectronic substrate is selected from the group consisting of silicon, silicon oxide, silicon nitride, silicon oxynitride, aluminum, tungsten, tungsten silicide, gallium arsenide, germanium, tantalum, tantalum nitrite, and SiGe.

17. The structure of claim 14, wherein said leg has a width "W" measured at the greatest distance between said vertical sidewalls and said horizontal section has a length "L" that is the greatest distance along a plane that is generally parallel to "W," wherein "W" is about 80% or less of "L."

18. A method of forming a microelectronic structure, said method comprising:
providing a microelectronic substrate having a surface, and optionally one or more intermediate layers on said surface, said substrate having an etch rate;
applying a hard mask composition to said substrate surface, or to an intermediate layer on said substrate surface, to form a hard mask layer thereon, said hard mask layer having an etch rate, wherein said hard mask etch rate is less than about ⅓ said substrate etch rate;
optionally forming one or more intermediate layers on said hard mask layer;
forming an imaging layer on said hard mask layer, or on intermediate layers on said hard mask;
exposing said imaging layer to light to yield light-exposed portions of the imaging layer;
developing said imaging layer after light exposure so as to remove said light-exposed portions, and portions of said hard mask layer adjacent said light-exposed portions, wherein said developing yields a T-shaped structure on said substrate surface, or on an intermediate layer on said substrate surface, said T-shaped structure comprising:
an upright leg having upper and lower portions joined by opposing vertical sidewalls that are generally perpendicular to said substrate surface, said lower portion contacting said substrate surface or intermediate layer, wherein said leg has a width "W" measured at the greatest distance between said vertical sidewalls and said horizontal section has a length "L" that is the greatest distance along a plane that is generally parallel to "W," wherein "W" is about 80% or less of "L"; and
a generally horizontal section being:
adjacent said upper portion or an intermediate layer on said upper portion; and
generally perpendicular to said vertical sidewalls.

19. A method of forming a microelectronic structure, said method comprising:
providing a microelectronic substrate having a surface, and optionally one or more intermediate layers on said surface;
applying a hard mask composition to said substrate surface, or to an intermediate layer on said substrate surface, to form a hard mask layer thereon;
optionally forming one or more intermediate layers on said hard mask layer;
forming an imaging layer on said hard mask layer, or on intermediate layers on said hard mask;
exposing said imaging layer to light to form light-exposed portions of the imaging layer;
developing said imaging layer after light exposure so as to remove said light-exposed portions, and portions of said hard mask layer adjacent said light-exposed portions, wherein said developing yields a T-shaped structure on said substrate surface, or on an intermediate layer on said substrate surface, said T-shaped structure comprising:
an upright leg having upper and lower portions joined by opposing vertical sidewalls that are generally perpendicular to said substrate surface, said lower portion contacting said substrate surface or intermediate layer and said vertical sidewalls and substrate surface forming an angle of from about 80° to about 100°, said leg having a width "W" defined as the greatest distance between said vertical sidewalls; and
a generally horizontal section having an upper surface and being:
adjacent said upper portion or an intermediate layer on said upper portion; and
generally perpendicular to said vertical sidewalls, said T-shaped structure has a height "H" defined as the greatest distance from the substrate surface to said upper surface, wherein "H"/"W" is from about 2 to about 5.

20. A composition useful as a hard mask layer, said composition comprising:

(A)

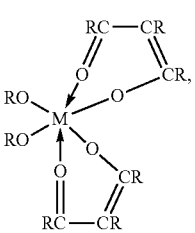

where: M is selected from the group consisting of Ti and Zr; and each R is individually selected from the group consisting of hydrogen, and alkyls;
(B) a compound comprising at least one —OH group;
(C) an aminoplast crosslinking agent; and
(D) a solvent system, wherein (A), (B), and (C) are dissolved or dispersed in said solvent system.

* * * * *